(12) United States Patent
Beerling (10) Patent No.: US 7,477,123 B2
(45) Date of Patent: Jan. 13, 2009

(54) PLANAR INDUCTOR USING LIQUID METAL MEMS TECHNOLOGY

(75) Inventor: Timothy Beerling, San Francisco, CA (US)

(73) Assignee: Agilent Technologies, Inc., Santa Clara, CA (US)

( * ) Notice: Subject to any disclaimer, the term of this patent is extended or adjusted under 35 U.S.C. 154(b) by 324 days.

(21) Appl. No.: 11/283,634

(22) Filed: Nov. 21, 2005

(65) Prior Publication Data

US 2007/0115084 A1   May 24, 2007

(51) Int. Cl.
*H01F 5/00* (2006.01)
(52) U.S. Cl. .................................. 336/200; 336/223
(58) Field of Classification Search .............. 336/200, 336/223, 232
See application file for complete search history.

(56) References Cited

U.S. PATENT DOCUMENTS

| 5,111,169 A | * | 5/1992 | Ikeda ......................... 333/181 |
| 6,856,499 B2 | | 2/2005 | Stokes |
| 6,885,275 B1 | | 4/2005 | Chang |
| 6,922,127 B2 | | 7/2005 | Zou et al. |

OTHER PUBLICATIONS

M. Raieszadeh, P. Monajemi, S. Yoon, J. Laskar, and F. Ayazi, "High-Q Integrated Inductors on Trenched Silicon Islands," Proc. IEEE Micro Electro Mechanical Systems Conference (MEMS'05), Miami FL, Jan. 2005, pp. 199-202.

A.S. Royet, R. Cuchet, D. Pellissier, P. Ancey, "On the Investigators of Spiral Inductors Processed on Si Substrates With Thick Porous Si Layers," ESSDERC 2003, 33rd European Solid-State Device Research Conference, Estoril, Portugal, Sep. 16-18, 2003, 4 pages.

Chian-Hsin Wu, "Analysis of On-Chip Spiral Inductors Using the Distributed Capacitance Model," IEEE Journal of Solid-State Circuits, vol. 38, No. 6, Jun. 2003, pp. 1040-1044.

H. Lakdawala, X. Zhu, H. Juo, S. Santhanam, L.R. Carley, and G. K. Fedder, "Micromachined High-Q Inductors in A 0.18um Copper Internconnect Low-K Dielectric CMOS Process," IEEE Journal of Solid-State Circuits, vol. 37, No. 3, Mar. 2002, pp. 394-403.

H. Kim, D. Zheng, A. J. Becker, and Y. Xie, "Spiral Inductors on Si p/p + Substrates with Resonant Frequency of 20 GHz," IEEE Electron Device Letters, vol. 22, No. 6, Jun. 2001, pp. 275-277.

C. Ahn, M. Allen, "Micromachined Planar Inductors on Silicon Wafers for MEMS Applications," IEEE Transactions on Industrial Electronics, vol. 45, No. 6, Dec. 1998, pp. 866-876.

Y. Xie, M. Frei, A. Becker, C. King, D. Kossives, L. Gomez, and S. Theiss, "An Approach for Fabricating High-Performance Inductors on Low-Resistivity Substrates," IEEE Journal of Solid-State Circuits, vol. 33, No. 9, Sep. 1998, pp. 1433-1438.

* cited by examiner

*Primary Examiner*—A. T. M.

(57) ABSTRACT

Using MEMS device design and fabrication techniques, liquid metal inductors can be formed. Because of the common fabrication techniques, liquid metal inductors can be more easily integrated with certain MEMS microswitches.

18 Claims, 4 Drawing Sheets

PLANAR INDUCTOR USING LIQUID METAL MEMS TECHNOLOGY

BACKGROUND

Since the introduction of micromachining technology and microelectromechanical systems (MEMS) in 1980s, many types of mechanical actuation methods have been explored. Numerous different types of micromechanical switches (microswitches) have been developed using different actuation methods and design techniques. Many microswitch designs use solid-to-solid contact switches that possess some of the same problems that macroscale mechanical switches possess, such as wear of switch contacts and signal bounce. Various liquid metal microswitch architectures have been implemented, and differences among the architectures include: mechanisms for actuating the switch (e.g., moving the liquid metal droplet or "slug"), devices and techniques for loading the switches with liquid metal, and fabrication techniques. While there has been significant effort in the development of various microswitch technologies, including liquid metal microswitches, less emphasis has been placed on development of other circuit components for use with these devices.

SUMMARY

Using MEMS device design and fabrication techniques, liquid metal inductors can be formed.

DETAILED DESCRIPTION

The following sets forth a detailed description of the best contemplated mode for carrying out the invention. The description is intended to be illustrative of the invention and should not be taken to be limiting.

Throughout this application, reference will be made to various MEMS device fabrication processes and techniques which will be well known to those skilled in the art. Many of these processes and techniques are borrowed from semiconductor device fabrication technology, e.g., photolithography techniques, thin film deposition and growth techniques, etching processes, etc., while other techniques have been developed and/or refined specifically for MEMS applications. Additionally, the presently described devices and techniques focus on the use of liquid metal in inductors. Examples of suitable liquid metals include mercury, gallium alloys, and indium alloys (e.g., Galinstan or GaInSn). Other examples of suitable liquid metals, e.g., with acceptable conductivity, stability, and surface tension properties, will be known to those skilled in the art. In still other examples, the presently described devices and techniques can be used in conjunction with other electrically conducting liquids to produce inductors.

FIGS. 1A-4C illustrate several different embodiments of liquid metal inductors and corresponding features used to configure the inductors and transport liquid metal into the inductors. In each of the examples illustrated, the inductor cavity is designed to be filled with liquid metal after the cavity is formed. In many cases cavity formation is not complete until two separate structures are bonded together. For example, various electrodes, heaters, insulators, cavity portions, and other circuit/MEMS devices can be fabricated on a first semiconductor wafer (e.g., silicon) using conventional semiconductor processing techniques. The remainder of the cavity structure (e.g., a cavity roof, lid, or enclosure) can be fabricated on a second wafer, and the two wafers aligned and bonded to form the complete structure. Numerous well known wafer bonding techniques, such as anodic bonding, fusion bonding, glass frit bonding, adhesive bonding, eutectic bonding, microwave bonding, thermocompression bonding, and solder bonding, can be used. Although the examples in accordance with the invention emphasize devices formed from two separate, bonded layers, sufficiently enclosed inductor cavities can be fabricated on a single wafer, and thus the presently described devices and techniques have equal applicability.

Figure 1A:
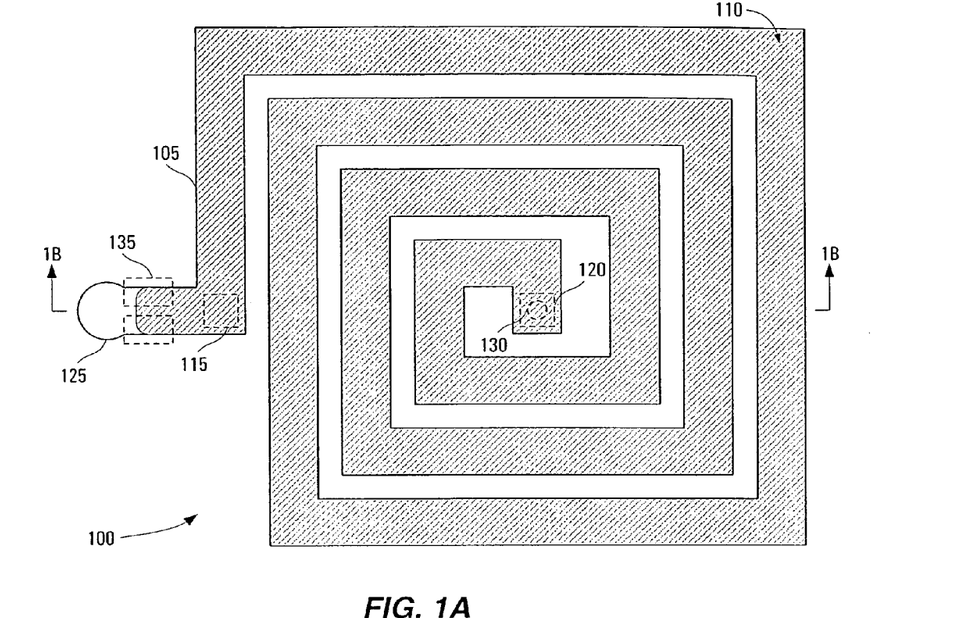
FIGS. 1A-1B illustrate two different views of a liquid metal inductor in accordance with the invention.
Figure 1B:
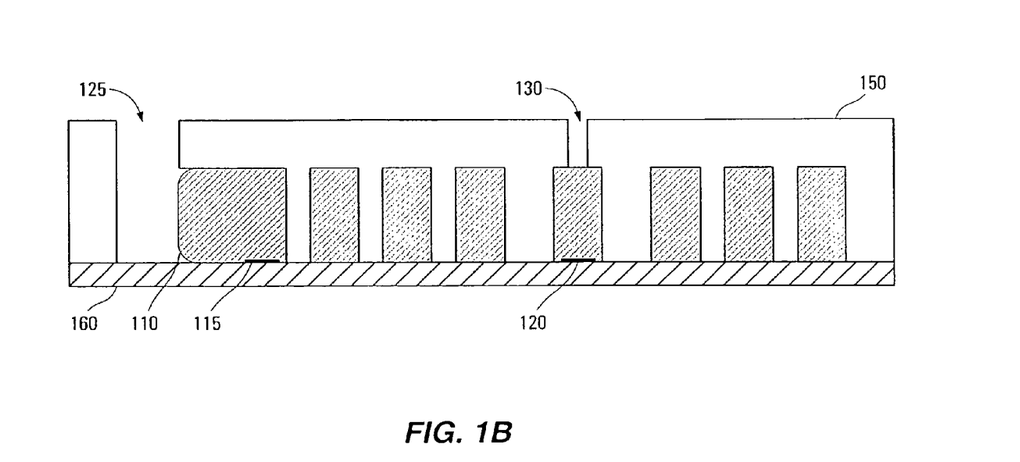

FIG. 1A illustrates a partial top view of a liquid metal inductor 100, shown in cross section in FIG. 1B. Liquid metal inductor 100 is formed from two separate material layers 150 and 160. In this case, each of material layers 150 and 160 are separate wafers (or portions thereof) that have been bonded together. For simplicity of illustration, numerous structures and features, such as various additional electrodes, vents, circuitry, etc., used in loading and operating the liquid metal inductor have been omitted from the figures. Liquid metal inductor 100 is formed by filling a generally spiral shaped channel or cavity 105 with a liquid metal or other sufficiently electrically conductive liquid. In this example, a spiral shape is approximated by a plurality of parallel and perpendicular (or at least roughly parallel and perpendicular) channel segments that together form the continuous channel. Because of the generally spiral shape of this channel, many of the channel segments will differ in length, and various different corner shapes and features can be fabricated. In one embodiment in accordance with the invention, liquid metal inductor 100 is to be used in conjunction with a liquid metal microswitch, and so the inductor can be fabricated using the same type of liquid metal material. Liquid metal 110 fills the inductor channel 105, and makes electrical contact at two ends with electrodes 115 and 120. Electrodes 115 and 120 are suitably coupled to other circuit elements (not shown) as desired. For example, additional metal traces in material layer 160 can electrically connect inductor 100 to other passive and/or active circuit components. As will be discussed in greater detail below, the inductance of liquid metal inductor 100 will generally depend on the number of turns, the size and shape of the channel, the type of liquid metal used, and features of the surrounding material (e.g., dielectric properties).

Electrodes 115 and 120 are formed to at least partially extend into channel 105 and make electrical contact with liquid metal 110. Electrodes 115 and 120 can be fabricated from any suitable conductor(s) compatible with surrounding materials and fabrication techniques. For example, depending on the choice of material for liquid metal 110, certain conductors may need to be selected for electrodes 115 and 120 such that they are not readily absorbed or amalgamated with the liquid metal. Additionally, although shown to have a particular size with respect to the channel width and a particular shape, electrodes 115 and 120 can be formed using various sizes and shapes, as will be understood by those skilled in the art. In general, as long as the electrodes provide adequate electrical coupling to the body of the liquid metal of the inductor, they will serve their purpose.

Liquid metal inductor 100 also includes an inlet 125 and a vent 130 formed in material layer 150 as part of or coupled to channel 105. These features allow for the introduction of liquid metal into channel 105, and its transportation throughout the length of the channel. Fluidic channel 105 provides a path along which liquid metal can be introduced and transported. These channels or cavities are typically surrounded on all sides by walls, with the exception of inlet 125 and vent 130. As will be known to those skilled in the art, various different techniques (e.g., vapor deposition, nozzle injection, etc.) can be used to place liquid metal 110 in channel 105, and various additional device features (e.g., additional vents, loading reservoirs, heaters, etc.) can be included to facilitate that process. Thus, depending design and fabrication choices, liquid metal inductor 100 can be loaded with liquid metal either before or after material layers 150 and 160 are bonded together.

Although many liquid metal inductor embodiments in accordance with the invention will utilize vent structures for loading the device with liquid metal, some embodiments in accordance with the invention need not use vents and thus liquid metal inductor 100 can be formed without vent 130. The process of loading liquid metal into channel 105 can be designed to account for the absence of a separate vent associated with the cavity. In one example, channel 105 is be pumped down in a vacuum, thereby removing some or all of the gas in the channel. The device as a whole (e.g., the bonded wafers) or a closed portion of the device (e.g., as defined by a manifold surrounding at least inlet 125) would then be subjected to a liquid metal bath also under vacuum. The pressure of the liquid metal bath is then raised (e.g., brought back to atmospheric pressure) to force the liquid metal into channel 105 as a result of the pressure gradient developed along the channel. This pressure gradient forces the liquid metal into the cavity without the need of a vent.

In those embodiments where one or more vents are used to provide an appropriate pressure gradient during the process of filling channel 105 with an appropriate amount of liquid metal, the vent can be open to the same side of the device (an part of the same material layer) as inlet 125 as illustrated, or it can be located on the opposite side of the device (e.g., through material layer 160). Vent 130 is typically smaller (at least in cross-sectional area) than channel 105 so as to decrease the chance that liquid metal can escape from vent 130 either during the process of filling the inductor, or in subsequent operation. Thus, because of the reduced cross-sectional area at the point where vent 130 meets channel 105, significant pressure would normally be required to force the channel's liquid metal contents into and through vent 130, provided the surfaces are non-wetting. Nevertheless, even relatively small vents can provide an adequate pressure gradient for the channel filling process, as will be understood by those skilled in the art.

Additionally, it may be desirable or necessary to plug or seal inlet 125 and/or vent 130 after the liquid metal is loaded into the inductor. Such plugs help to prevent evaporation and contamination of the liquid metal. In some embodiments, the same liquid metal used for the inductor can be used for a plug, alone or alloyed with another material. In other embodiments, semi-solid or very high viscosity materials (e.g., waxes, glasses, etc.), solders, or bonded capping layers can also be used. In still other embodiments, material can be deposited (e.g., via chemical vapor deposition (CVD), physical vapor deposition (PVD), and atomic layer deposition (ALD), or other deposition techniques) to plug inlets/vents.

Thus, numerous different techniques can be used to provide the proper amount of liquid metal in the inductor channel. Further examples of these devices and techniques for liquid metal loading described above can be found in U.S. patent application Ser. No. 11/130,846, assigned to the assignee of the present application. In another technique in accordance with the invention, liquid metal is electroplated on a specially formed receiving surface (e.g., mercury electroplated on an iridium thin film). In still another technique in accordance with the invention, liquid metal vapor is deposited using selective condensation on specialized nucleation sites (e.g., mercury vapor on gold nucleation sites). In still other techniques, liquid metal is dispensed through nozzles onto a surface. In yet another technique, the metal used is generally in a liquid state only during loading. For example, the device is loaded at temperature higher than normal operating temperature where the metal or alloy is in a liquid state. Once loaded into the inductor channel, the liquid metal is allowed to cool, freezing the metal in place.

The geometries of the fluidic channels and vents illustrated can also vary according to a number of parameters. These paths can have a variety of different lengths, cross-sectional shapes, cross-sectional areas, etc. The paths can generally be coupled to corresponding inductor cavities at any surface of the cavity as desired. Paths can be straight (e.g., through holes or vias), have one or more turns (at various angles), or even be curved or contoured. The paths shown in FIGS. 1A-1B are generally co-planar, but that need not be the case. In short, those skilled in the art will readily recognize numerous variations on the shape, size, and location of the vents and fluidic channels described herein.

Since controlling the position of liquid metal 110 within channel 105 is important to proper operation of inductor 100, various material features, devices, and techniques can be used to control the wettability of different portions of channel 105, thereby affecting the flow properties of the liquid metal. For example, one or more of the surfaces of channel 105 can include one or more defined areas that alter and/or define the contact angle between liquid metal 110 and channel 105. The contact angle, sometimes referred to as the wetting angle, is a quantitative measure of the wetting of a solid by a liquid. It is defined geometrically as the angle formed by a liquid at the three phase boundary where a liquid, gas and solid intersect. The contact angle is a function of the liquid's surface tension and the surface free energy of the substrate. In general, the contact angle between a conductive liquid and a surface with which it is in contact ranges between 0° and 180° and is dependent upon the material from which the droplet is formed, the material of the surface with which the droplet is in contact, and is specifically related to the surface tension of the liquid. A high contact angle is formed when the droplet contacts a surface that is referred to as relatively non-wetting, or less wettable. A more wettable surface corresponds to a lower contact angle than a less wettable surface. An intermediate contact angle is one that can be defined by selection of the material covering the surface on which the droplet is in contact and is generally an angle between the high contact angle and the low contact angle corresponding to the non-wetting and wetting surfaces, respectively.

For example, it may be desirable to prevent liquid metal 110 from easily traveling too close to inlet 125. Thus, portions of channel 105 can be defined to be wetting, non-wetting, or to have an intermediate contact angle. Portions of channel 105 near inlet 125 can be less, or non-wetting to prevent liquid metal 110 from entering these areas, and possibly escaping the channel or increasing the likelihood that a gas bubble will enter the liquid metal (e.g., separating it into two or more separate portions). As will be known in the art, surface wettability can be controlled, at least in part, by careful selection of surface material, surface features, and by using other techniques such as electrowetting (discussed in greater detail below). For example, various dielectrics such as silicon dioxide ($SiO_2$) or silicon nitride (SiN), metals, and other materials can be used to control surface wettability. At some locations along the fluid path, it may nevertheless be desirable to have localized areas that are wettable so as to enhance movement of liquid metal at particular times, e.g., during liquid metal filling. Consequently, certain locations (not shown) can include surface coatings that are wettable, and/or other device features (e.g., electrodes 135 discussed below and used for electrowetting) to enhance wettability. Tailored wettability, at least with respect to the liquid metal used in the device, can also help establish the desired capillary forces (e.g., dielectric surfaces are generally non-wetting for liquid metals while metal surfaces are generally wetting) and contact angle of the liquid metal used in the inductor.

Electrodes 135 are generally insulated from direct electrical contact with liquid metal 110, e.g., using an intervening insulating layer or the like, and are used for electrowetting, e.g., for loading the liquid metal, for constraining its movement, and the like. As an illustration of the electrowetting effect, placement of a liquid droplet on a non-wetting surface causes the droplet to maintain a high contact angle. If the liquid droplet is polarizable and/or at least slightly electrically conductive, an electrical potential applied between the droplet and an insulated electrode underneath the droplet, reduces the droplet's contact angle with the surface on which it rests. Reducing the droplet's contact angle improves wetting with respect to the surface. The reduction in contact angle occurs because of electrostatic forces try to increase the capacitance and stored energy in the droplet/insulator/electrode system. The effect depends on a number of factors including applied voltage (and thus electrode configuration), insulator parameters (e.g., thickness and dielectric constant), and liquid droplet properties. However, with proper selection of system properties, relatively large and reversible contact angle changes are achieved. In some embodiments in accordance with the invention, certain electrodes can be grounded while others are maintained at a higher voltage. In other embodiments in accordance with the invention, electrodes are alternately charged without the use of a ground electrode. This technique generally requires the control electrode pitch to be sufficiently smaller than the liquid metal droplet size. In addition to affecting the local wettability where the droplet rests, application of an electric field (e.g., on one side of the droplet) can induce forces on the liquid metal droplet, causing actuation.

The size and shape of electrodes 135 are merely illustrative, and various different electrode sizes and shapes can be used. Additional electrodes, either in material layer 160 or possibly in material layer 150, can be included in support of some electrowetting configurations. Numerous other electrode arrangements can be implemented. For example, ground electrodes can be insulated from, or in direct electrical contact with, the liquid metal. Ground electrodes can be placed in the same material layer as the control electrodes. Moreover, both material layers can contain control electrodes, e.g., facing pairs of electrodes with opposite polarity when energized. In general, such actuation can be achieved as long as the potential of the liquid metal droplet is different from at least one of the electrodes. Thus, electrowetting devices and techniques can be used in conjunction with any of the inductors described.

Although inductors such as inductor 100 can be formed in a variety of winding shapes, the planar spiral topology illustrated in FIGS. 1A-1B are generally the easiest to fabricate. Note that the inductors of FIGS. 1A-4C are generally spiral in shape, but numerous variation on this spiral shape can be implemented in accordance with the invention. For example, channel 105 can be fabricated to have curved walls instead of the straight walls illustrated, thereby my closely resembling a true spiral shape. Similarly, hexagonal or octagonal shapes can be used to more closely mimic a true spiral. Still other shapes will be known to those skilled in the art.

While inductors are often characterized by their inductance (or inductive reactance) value alone, a more common measure of an inductor's performance is its quality factor or Q value. For planar inductors, the quality factor is directly proportional to the inductor's inductance or inductive reactance, and inversely proportional to the inductor's resistance. In general, the higher the value for Q, the better the inductor is and the more suitable it is for various applications. Because inductive reactance and various resistive effects of inductors (wire skin effect, radiation losses, eddy current, and hysteresis) vary with frequency, Q values are most meaningful when specified for a specific operating frequency.

The inductance of inductor 100 is generally determined by the overall length of the conductor (liquid metal 110) and by the number of turns in the planar inductor. Inter-turn capacitance can also affect inductor performance, so the separation of inductor turns can be selected to reduce or minimize that parasitic capacitance. Inductor performance can also be improved by taking steps to reduce the resistance of the inductor. For example, lower resistivity liquid metals can be selected. Moreover, the size and shape of channel 105 (and thus the liquid metal constrained therein) can be designed to reduce the resistance. For planar inductors, the current traveling through the inductor is generally pushed to the outer edges (with respect to the center of the coil) of the coil windings. When current is crowded at the outer edges, increasing the width of the channel (e.g., as seen in cross-section in FIG. 1A) generally does not reduce the resistance or improve Q. However, increasing the conductor thickness (i.e., its height as seen in cross-section in FIG. 1A) generally does reduce resistance and improve Q. Thus, the performance of inductor 100 can be improved by increasing the aspect ratio of the channel cross-section, e.g., the 2/1 aspect ratio illustrated, or even greater aspect ratios such as 3/1 or 4/1. Conductor thickness is relatively easy to increase for liquid metal conductors as compared to conductors fabricated using more traditional semiconductor processing techniques. Performance of inductor 100 will also depend on upon loss and parasitics due to the substrate on which the inductor is formed. To some extent, these effects can be limited by limiting the area consumed by the inductor, but as will be seen below in connection with FIGS. 4A-4C, various other techniques can be employed to reduce losses caused by eddy currents induced in the inductor substrate.

Fabrication of inductor 100 can utilize various semiconductor and MEMS manufacturing techniques. In one embodiment in accordance with the invention, material layer 160 is a silicon wafer substrate that includes multiple material layer features (not shown), generally applied using thin-film semiconductor wafer processing techniques. Substrate 160 can be fully or partially covered with dielectric materials and other material layers, e.g., using thin film deposition techniques and/or thick film screening techniques which could comprise either single layer or multi-layer circuit substrates. For example, electrodes 135 can be a deposited metal layer that is subsequently covered with a dielectric layer. Metals or other materials may also be deposited to assist in the bonding of substrate 160 to material layer 150, which includes channel walls and inlet features and operates as a cap for the device. Metallic material can also deposited or otherwise applied to material layer 150 to form electrodes or other features as desired. Material layer 150 can be a wafer of glass, for example, Pyrex®, or another material such as silicon. Bonding material layer 150 to substrate 160 may also be accomplished using any of the above mentioned bonding techniques. For example, the two layers can be joined using anodic bonding, in which case certain regions (not shown) of one or both layers might include a layer of amorphous silicon or polysilicon to facilitate bonding. Suitable output contacts (for connection to other circuitry) can also be provided. In some embodiments in accordance with the invention, inductor 100 is integrated with various other circuit elements.

Liquid metal inductor 100 provides one example of a basic inductor design in accordance with the present invention. FIGS. 2A-4C illustrate several different embodiments of liquid metal inductors. In each of the examples illustrated, a channel in the device is designed to include liquid metal that forms the central conductor of the inductor. These other embodiments are described below. However, at least some of the design variations, material selections, fabrication techniques, and related inductor features described above in the context of inductor 100 are applicable to the various inductors illustrated in FIGS. 2A-4C. Consequently, many of these design and fabrication variations are not repeated below in the interest of clarity.

Figure 2A:
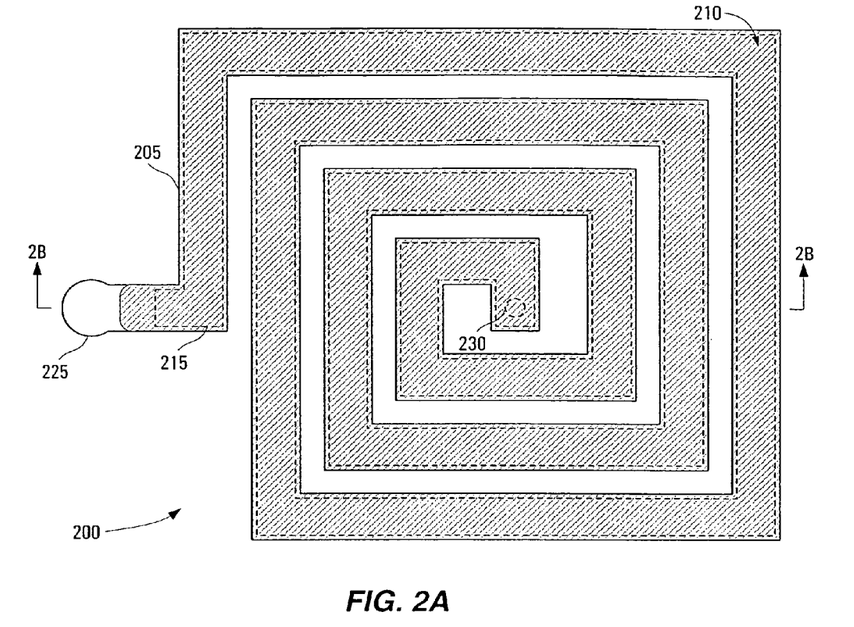
FIGS. 2A-2B illustrate two different views of another liquid metal inductor in accordance with the invention.
Figure 2B:
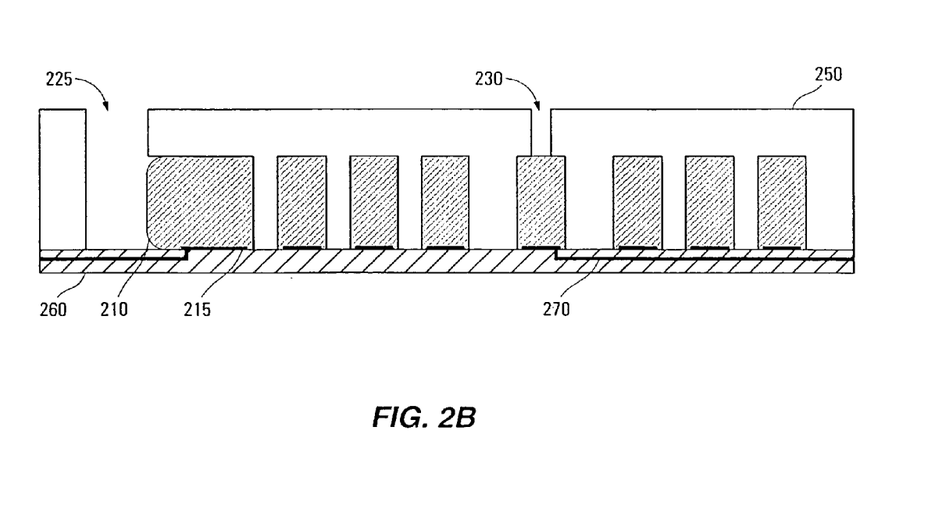

FIG. 2A illustrates a partial top view of another liquid metal inductor 200, shown in cross section in FIG. 2B. Liquid metal inductor 200 is formed from two separate material layers 250 and 260, e.g., separate wafers (or portions thereof) that have been bonded together. For simplicity of illustration, numerous structures and features, such as various additional electrodes, vents, circuitry, etc., used in loading and operating the liquid metal inductor have been omitted from the figures. Liquid metal inductor 200 has the same generally spiral shape as inductor 100. Thus, inductor channel 205 is filled with liquid metal 210 or another sufficiently electrically conductive liquid. In contrast to inductor 100, liquid metal inductor 200 has a continuous electrode 215 formed along the floor of channel 205 and making electrical contact with liquid metal 210. One or more substrate traces (e.g., 270) couple inductor 200 to other circuit elements (not shown) as desired. Electrode 215 can be fabricated from any suitable conductor(s) compatible with surrounding materials and fabrication techniques. For example, depending on the choice of material for liquid metal 210, certain conductors may need to be selected for electrode 215 such that they are not readily absorbed or amalgamated with the liquid metal. Additionally, although shown to have a particular size and shape with respect to the channel width, electrode 215 can be formed using various sizes and shapes, as will be understood by those skilled in the art.

In addition to providing electrical contact to liquid metal 210, electrode 215 also carries inductor current as part of the inductor. Because electrode 215 is metallic, it also provides a wettable floor for channel 205, thereby easing loading of liquid metal 210 into channel 205. In some embodiments in accordance with the invention, capillary forces assisted by the improved wettability of the channel may be adequate to load the channel, e.g., no applied pressure is needed. Although electrode 215 is shown only on the floor of channel 205, in other embodiments in accordance with the invention electrode 205 is on multiple surfaces of the channel, e.g., at least partially on the side walls and/or the top of the channel as formed by material layer 250.

Liquid metal inductor 200 also includes an inlet 225 and a vent 230 formed in material layer 250 as part of or coupled to channel 205. These features allow for the introduction of liquid metal into channel 205, and its transportation throughout the length of the channel. As discussed above, various techniques (e.g., vapor deposition, nozzle injection, etc.) can be used to place liquid metal 210 in channel 205, and various additional device features (e.g., additional vents, loading reservoirs, heaters, electrowetting electrodes, surface features, etc.) can be included to facilitate that process.

Figure 3A:
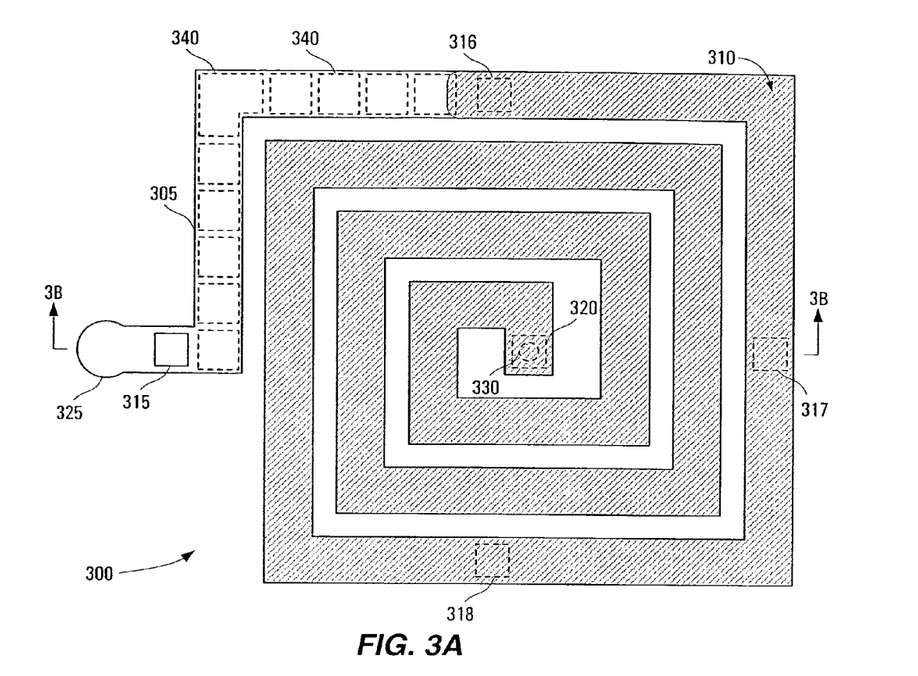
FIGS. 3A-3B illustrate two different views of yet another liquid metal inductor in accordance with the invention.
Figure 3B:
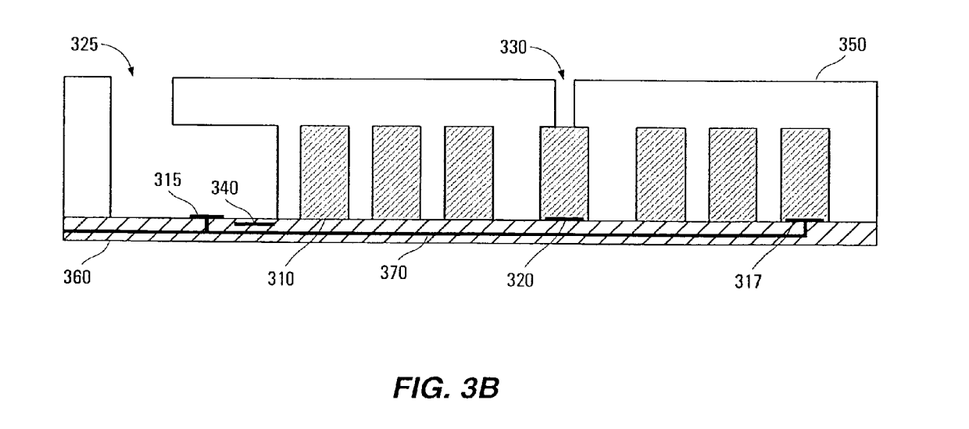

FIG. 3A illustrates a partial top view of still another liquid metal inductor 300, shown in cross section in FIG. 3B. Liquid metal inductor 300 is formed from two separate material layers 350 and 360, e.g., separate wafers (or portions thereof) that have been bonded together. For simplicity of illustration, numerous structures and features, such as various additional electrodes, vents, circuitry, etc., used in loading and operating the liquid metal inductor have been omitted from the figures. Liquid metal inductor 300 has the same generally spiral shape as inductor 100. Thus, inductor channel 305 contains liquid metal 310 or another sufficiently electrically conductive liquid. Liquid metal 310 makes electrical contact with at least two of electrodes 315-318 and 320. Inductor 300 includes more than three electrodes so that the inductance can be adjusted by limiting the amount of liquid metal in channel 310, or filling channel completely, but selectively choosing which two electrodes represent the ends of the inductor coil, thereby choosing a coil length. Thus, as shown in FIGS. 3A-3B, liquid metal does not necessarily completely fill channel 305, but instead may only fill channel 305 approximately to the location of electrode 316. Liquid metal 310 makes contact with two end electrodes (316 and 320) and also makes contact with intermediate electrodes 317 and 318. Each of electrodes 315-318 and 320 are suitably coupled to other circuit elements (not shown) as desired. In the example illustrated, electrodes 315-318 are electrically coupled to each other (via trace 370) because each one is potentially one node of the inductor, while electrode 320 serves as the other node of the inductor.

Electrodes 315-318 and 320 can be fabricated from any suitable conductor(s) compatible with surrounding materials and fabrication techniques. For example, depending on the choice of material for liquid metal 310, certain electrode materials may need to be selected such that they are not readily absorbed or amalgamated with the liquid metal. Additionally, although shown to have particular sizes, shapes, and locations, numerous different implementations of electrodes 315-318 and 320 (varying, for example, in number, size location, shape, etc.) will be understood by those skilled in the art.

As noted above, various surface materials, surface features, electrodes, etc., can be used to adjust the wettability of channel 305 surfaces at different locations. In FIGS. 3A-3B, a series of electrowetting electrodes 340 are included to enhance liquid metal loading and/or to confine liquid metal to particular regions of channel 305. Although only shown between electrode 315 and 316, such electrodes can generally be located anywhere (e.g., continuously along channel 305, localized in channel corners, located only near electrodes, etc.) along channel 305, can use various different electrode configurations, and can be formed in various shapes and sizes as will be known to those skilled in the art. Electrowetting electrodes can also include electrodes used for other purposes such as electrodes 315-318 and 320 (e.g., used to ground the liquid metal during electrowetting). Liquid metal inductor 300 also includes an inlet 325 and vent 330 formed in material layer 350 as part of or coupled to channel 305. These features allow for the introduction of liquid metal into channel 305, and its transportation throughout the length of the channel. As discussed above, various techniques (e.g., vapor deposition, nozzle injection, etc.) can be used to place liquid metal 310 in channel 305, and various additional device features (e.g., additional vents, loading reservoirs, heaters, electrowetting electrodes, surface features, etc.) can be included to facilitate that process.

Figure 4A:
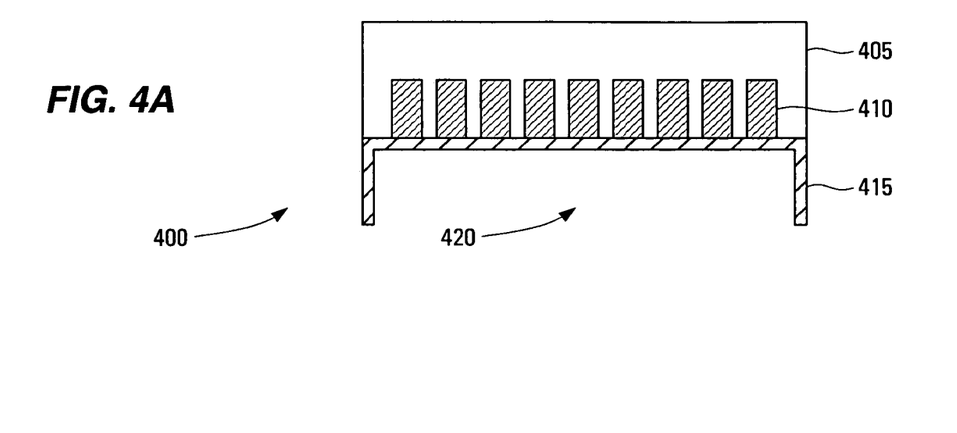
FIGS. 4A-4C illustrate several techniques that can be used to enhance the performance of liquid metal inductors in accordance with the invention.
Figure 4B:
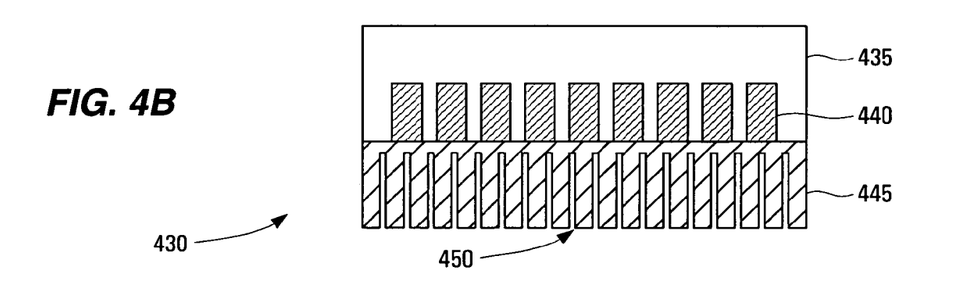
Figure 4C:
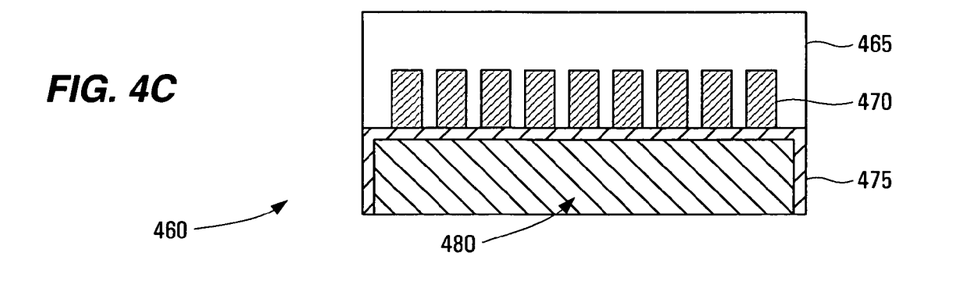

As noted above, substrate losses associated with planar inductors contribute to energy losses and hence reduce the quality factor Q. Substrate losses generally result from eddy currents induced in the substrate (e.g., $I^2R$ losses due to currents flowing through the inductor metal to substrate capacitance and currents generated in the substrate by the inductor's changing magnetic field). Some techniques for reducing eddy current loses include shorting the substrate, use of ground shields, and increasing the substrate resistance. FIGS. 4A-4C illustrate several techniques for increasing the effective resistance of the substrate on which a liquid metal inductor is formed.

Perhaps the simplest technique is to use inherently high resistivity or insulating substrates such as high resistivity silicon, sapphire, alumina, or glasses such as Pyrex. However, the use of such high resistivity materials may not be well suited to other fabrication processes used to form liquid metal planar inductors. FIG. 4A illustrates a liquid metal inductor 400 is formed from two bonded wafers 405 and 415, and with liquid metal 410 providing the conductor for the inductor. Here, the effective resistance of substrate 415 (e.g., a silicon wafer) is reduced in the area beneath the inductor coils by removing portions of the substrate. Thus, photolithographic patterning and etching techniques (wet or dry) are used to fabricate cavity 420 beneath the inductor coils. In this manner significant substrate losses are eliminated by removing the underlying silicon, e.g., in a post processing step.

FIG. 4B illustrates a less drastic, and perhaps more structurally stable approach. Here, liquid metal inductor 430 is formed from two bonded wafers 445 and 435, and with liquid metal 440 providing the conductor for the inductor. Instead of etching away a complete cavity beneath the inductor, the area beneath the inductor coils is selectively etched to form various gaps 450. Although the cross-section illustrated suggests that the etched regions might extend the entire width (i.e., into and out of the page) of the inductor coils, this need not be the case. Thus, an alternating pattern of etched and non-etched regions can provide reduction in eddy currents while still maintaining the structural integrity of substrate 445. In the example illustrated, the pitch of the etched regions is generally smaller than the inductor line width, although this need not be the case. Moreover, the example shown provides no specific relationship between the location of etched regions and the location of inductor coil portions, but a more defined pattern may be beneficial in some implementations. Since potions of the inductor coil may be, for example, parallel to the page, etched regions (not shown) can also follow the general pattern of the inductor coil. Gaps 450 can be formed using a variety of techniques including, for example, deep reactive ion etching processes such as the well known Bosch process.

Finally, FIG. 4C utilizes a region of porous silicon 480 to increase the resistivity below the indictor coils. So, like the previous examples, liquid metal inductor 450 is formed from two bonded wafers 465 and 475, and with liquid metal 470 providing the conductor for the inductor. However, a portion of substrate silicon substrate 475 is either pre-processed or post-processed to form porous silicon region 480. Porous silicon (including various forms such as oxidized porous silicon) is typically fabricated by electrochemical etching or electrochemical anodization of a silicon wafer in hydrofluoric (HF) acid solutions, e.g., diluted aqueous HF or ethanoic HF (often used because of the increased wettability of the etchant on the silicon surface). Various anodization arrangements, e.g., potentiostatic (voltage-controlled) or in galvanostatic (current-controlled), with different anode/cathode configurations will be well known to those skilled in the art. Additionally, the anodization process can be modulated, e.g., by varying the applied current density. Modulation results in controlled changes of the microstructure and the porosity of the porous silicon along the growth direction. Still another technique for forming porous silicon is stain etching, or chemical etching (with no current flow), performed with HF-HNO3 solution. Etching is typically followed by drying steps and oxidation steps to provide desired material properties. Various other techniques in accordance with the invention can be used to reduce undesirable losses associated with the inductor's substrate.

Those skilled in the art will readily recognize that a variety of different types of components and materials can be used in place of the components and materials discussed above. Moreover, the description of the embodiments in accordance with the invention set forth herein is illustrative and is not intended to limit the scope of the invention as set forth in the following claims. Variations and modifications of the embodiments disclosed herein may be made based on the description set forth herein, without departing from the scope and spirit of the invention as set forth in the following claims.

What is claimed is:

1. An apparatus comprising:
   a device substrate;
   an inductor channel at least partially defined by a portion of the device substrate, wherein the inductor channel further comprises at least one of a generally spiral shape, and a plurality of substantially parallel channel segments; and
   a liquid conductor disposed in the inductor channel, wherein the liquid conductor is liquid at an operating temperature of the apparatus.

2. The apparatus of claim 1 further comprising:
   at least one electrode at least partially exposed to a surface of the inductor channel, wherein the at least one electrode is operable to couple the liquid conductor to another circuit element.

3. The apparatus of claim 1, wherein the liquid conductor comprises at least one of mercury, a gallium alloy, and an indium alloy.

4. The apparatus of claim 1 wherein the liquid conductor further comprises at least one of an electrically conductive liquid, a liquid metal, and a liquid metal alloy.

5. The apparatus of claim 1 further comprising:
   at least one electrode positioned in proximity to a surface of the inductor channel and configured to affect the wettability of at least a portion of the surface of the inductor channel.

6. The apparatus of claim 1 further comprising a second device substrate coupled to the device substrate, wherein a portion of the second device substrate further defines the inductor channel.

7. The apparatus of claim 1 wherein the inductor channel is substantially enclosed.

8. The apparatus of claim 1 further comprising: an electrically conducting layer disposed on a surface of the inductor channel and extending at least half the length of the channel.

9. The apparatus of claim 1 further comprising at least one of: an inlet coupled to the inductor channel configured to allow introduction of the liquid conductor into the inductor channel; and a vent coupled to the inductor channel for allowing removal of gas in the inductor channel.

10. The apparatus of claim 1 further comprising:
an etched region located beneath at least a portion of the inductor channel, wherein the etched region is formed in at least one of the device substrate and a second device substrate coupled to the device substrate, and wherein the etched region has a higher resistivity than surrounding portions of the at least one of the device substrate and the second device substrate.

11. The apparatus of claim 10 wherein the etched region further comprises at least one of porous silicon, a cavity, and a gap.

12. The apparatus of claim 1, further comprising means for controlling the wettability of at least a portion of a surface of the inductor channel.

13. An apparatus comprising:
a device substrate;
an inductor channel at least partially defined by a portion of the device substrate, wherein the inductor channel further comprises at least one of a generally spiral shape, and a plurality of substantially parallel channel segments;
a liquid conductor disposed in the inductor channel; and
a plurality of electrodes exposed to a surface of the inductor channel, wherein the electrodes are operable to couple the liquid conductor to another circuit element, wherein at least two of the plurality of electrodes are alternately selectable so as to vary an inductance of the liquid conductor disposed in the inductor channel.

14. An apparatus comprising:
an electrically conductive liquid means, wherein the electrically conductive liquid means is liquid at an operating temperature of the apparatus; and
a means for containing the electrically conductive liquid means in a generally spiral inductor shape.

15. The apparatus of claim 14, wherein the means for containing the electrically conductive liquid means in a generally spiral inductor shape comprises:
a first substrate;
a second substrate coupled to the first substrate, wherein a portion of the first substrate together with a portion of the second substrate define a channel for containing the electrically conductive liquid means.

16. The apparatus of claim 15, further comprising at least one of: an inlet coupled to the channel configured to allow introduction of the electrically conductive liquid into the channel; and a vent coupled to the channel for allowing removal of gas in the channel.

17. The apparatus of claim 15, further comprising means for controlling the wettability of at least a portion of a surface of the channel.

18. The apparatus of claim 14, wherein the electrically conductive liquid comprises at least one of mercury, a gallium alloy, and an indium alloy.

* * * * *